(12) United States Patent
Lee

(10) Patent No.: US 9,153,492 B2
(45) Date of Patent: Oct. 6, 2015

(54) SEMICONDUCTOR DEVICE AND METHOD FOR FABRICATING THE SAME

(71) Applicant: SK hynix Inc., Icheon (KR)

(72) Inventor: Dong Ryeol Lee, Seongnam (KR)

(73) Assignee: SK Hynix Inc., Icheon (KR)

( * ) Notice: Subject to any disclaimer, the term of this patent is extended or adjusted under 35 U.S.C. 154(b) by 0 days.

(21) Appl. No.: 14/645,349

(22) Filed: Mar. 11, 2015

(65) Prior Publication Data

US 2015/0187648 A1    Jul. 2, 2015

Related U.S. Application Data

(62) Division of application No. 13/722,757, filed on Dec. 20, 2012, now Pat. No. 9,006,866.

(30) Foreign Application Priority Data

Aug. 20, 2012   (KR) ........................ 10-2012-0090828

(51) Int. Cl.
| | |
|---|---|
| *H01L 21/44* | (2006.01) |
| *H01L 21/768* | (2006.01) |
| *H01L 23/538* | (2006.01) |
| *H01L 21/48* | (2006.01) |
| *H01L 23/522* | (2006.01) |
| *H01L 23/48* | (2006.01) |
| *H01L 21/306* | (2006.01) |

(52) U.S. Cl.
CPC .... *H01L 21/76898* (2013.01); *H01L 21/30604* (2013.01); *H01L 21/486* (2013.01); *H01L 21/76831* (2013.01); *H01L 21/76832* (2013.01); *H01L 21/76883* (2013.01); *H01L 23/481* (2013.01); *H01L 23/5226* (2013.01); *H01L 23/5384* (2013.01); *H01L 2924/0002* (2013.01)

(58) Field of Classification Search
USPC ......... 438/627, 629, 630, 637–640, 643, 653, 438/667, 668, 672, 674; 257/E21.584, 257/E21.577, E21.585–E21.588, E21.597
See application file for complete search history.

(56) References Cited

U.S. PATENT DOCUMENTS

| | | | |
|---|---|---|---|
| 2011/0133335 A1 | 6/2011 | Chen | |
| 2011/0226730 A1 | 9/2011 | Pratt | |
| 2012/0086109 A1* | 4/2012 | Kim et al. | ..................... 257/659 |
| 2012/0276733 A1* | 11/2012 | Saeki et al. | ................... 438/613 |

* cited by examiner

*Primary Examiner* — Jasmine Clark

(57) ABSTRACT

A semiconductor device and a method for fabricating the same are disclosed, which can prevent migration of copper (Cu) ion when forming a Through Silicon Via (TSV). The semiconductor device includes a through silicon via (TSV) formed to pass through a semiconductor substrate; an oxide film located at a lower sidewall of the TSV; and a first prevention film formed to cover an upper portion of the TSV, an upper sidewall of the TSV, and an upper surface of the oxide film.

10 Claims, 12 Drawing Sheets

SEMICONDUCTOR DEVICE AND METHOD FOR FABRICATING THE SAME

CROSS-REFERENCE TO RELATED APPLICATION

The present application is a divisional of U.S. application Ser. No. 13/722,757 filed on Dec. 20, 2012, now U.S. Pat. No. 9,006,866, which claims priority to Korean patent application No. 10-2012-0090828 filed on 20 Aug. 2012, the disclosures of which are hereby incorporated by reference in their entirety.

BACKGROUND OF THE INVENTION

Embodiments of the present invention relate to a semiconductor device and a method for fabricating the same, and more particularly to a technology for preventing migration of metal, for example, copper (Cu) ion when forming a Through Silicon Via (TSV) with copper.

Among packaging technologies of semiconductor integrated circuits (ICs), a three-dimensional stack technology has been rapidly developed to increase packaging density as well as to reduce the size of electronic components, resulting in production of a high-performance semiconductor device. The 3D stacked package is formed by stacking a plurality of chips that have the same memory capacity, and is generally called a stack chip package.

The stack chip package is advantageous because it can result in reduced production costs of the package and because it can be produced on a mass production basis. In contrast, the stack chip package is disadvantageous in that since the number and size of stacked chips are often increased, a line space for electric connection of the package becomes reduced to an insufficient size.

That is, the conventional stack chip package includes a plurality of chips each mounted on substrates which are attached to each other. This configuration enables a bonding pad of each chip to be electrically connected to a conductive circuit pattern of a substrate through wiring. However, a space for wire bonding and a circuit pattern area for a substrate connected to the wire are needed, resulting in an increase in size of the semiconductor package.

In order to solve the above-mentioned problems, a Through Silicon Via (TSV) structure has been proposed to implement a stack chip package. In more detail, after forming a TSV in each chip in a wafer, physical and electrical connection between chips is vertically achieved by the TSV.

However, if the TSV is exposed by repeated heat treatment during a fabrication process, a metal material (e.g., Cu ion) contained in the TSV may be stressed and gather in an active region of the semiconductor device. The gathered metal material may serve as a generation and recombination center of minority carriers in such a manner that a leakage current occurs. Thus, electrical characteristics of the semiconductor package are deteriorated.

When forming a TSV configured to pass through a semiconductor substrate and an interlayer insulation film, Cu ions may migrate through oxide films before being absorbed in an active region of the semiconductor substrate of the cell region, thus causing a crack in a bit line contact deposited over the active region.

BRIEF SUMMARY OF THE INVENTION

Various embodiments of the present invention are directed to providing a semiconductor device and a method for fabricating the same that substantially obviate one or more problems due to limitations and disadvantages of the related art.

An embodiment of the present invention relates to a semiconductor device and a method for fabricating the same, which can prevent the occurrence of Cu migration when forming a through silicon via (TSV).

In accordance with an aspect of the present invention, semiconductor device includes: a through silicon via (TSV) configured to pass through a semiconductor substrate; an oxide film located over a lower sidewall of the TSV; and a first prevention film formed to cover an upper surface of the TSV, an upper portion of a sidewall of the TSV, and an upper surface of the oxide film.

In accordance with another aspect of the present invention, a semiconductor device includes a through silicon via (TSV) formed to pass through a semiconductor substrate; an oxide film located over a lower sidewall of the TSV; and a first prevention film formed to cover an upper surface of the TSV, wherein a portion of the first prevention film formed at an upper edge of the TSV has a sloped surface.

In accordance with another aspect of the present invention, a semiconductor device includes: a through silicon via (TSV) configured to pass through a semiconductor substrate; an oxide film located over a lower sidewall of the TSV and located to be lower than an upper surface of the semiconductor substrate; and a first prevention film formed over the TSV and the oxide film and formed between a sidewall of the TSV and the semiconductor substrate.

The device may further include a second prevention film formed between a sidewall of the TSV and the oxide film. Each of the first prevention film and the second prevention film includes a material having a lower etch selectivity than the oxide film.

Each of the first prevention film and the second prevention film is formed of any of a nitride material, a poly material, and a combination thereof. The semiconductor device may further include a metal barrier film formed between the sidewall of the TSV and the second prevention film and between the upper surface of the TSV and the first prevention film.

The semiconductor device may further include a metal barrier film formed between a sidewall of the TSV and the oxide film and between the upper surface of the TSV and the first prevention film.

The metal barrier film is formed of any of a tantalum (Ta) film, a titanium (Ti) film, and a laminated stack thereof. The metal barrier film is formed to have a thickness of 1000 Å~5000 Å.

In accordance with another aspect of the present invention, a method for fabricating a semiconductor device includes: forming a hole in a semiconductor substrate, forming an oxide film and a metal barrier film over an inner surface of the hole, and filling the hole with a conductive material to form a TSV; removing a back side the semiconductor substrate by a predetermined depth to expose the oxide film; removing the oxide film using the metal barrier film as a mask; and forming a first prevention film to cover an upper portion of the metal barrier film.

The formation of the TSV further includes: forming a second prevention film between the oxide film and the barrier metal film.

The removing of the semiconductor substrate includes: etching the semiconductor substrate so that a portion of the semiconductor substrate has a sloped step down from an upper surface of the TSV.

The formation of the first prevention film includes: forming the first prevention film to (i) cover the upper surface of the TSV and (ii) and cover the sloped step portion of the semiconductor substrate.

The removing of the semiconductor substrate includes: etching the semiconductor substrate by using HBr gas of 1000~2000 sccm, $O_2$ gas of 5~10 sccm, and He gas of 100~500 sccm in a high pressure of 500~4000 mT, with a top power of 1000~4500 W, and with a bottom power of 100~500 W.

In accordance with another aspect of the present invention, a method for fabricating a semiconductor device includes: forming a hole in a semiconductor substrate, forming an oxide film and a metal barrier film over an inner surface of the hole, and filling the hole with a conductive material to form a Through Silicon Via (TSV); removing a back side of the semiconductor substrate using the oxide film as a mask to expose an upper surface of the oxide film; removing the exposed upper surface of the oxide film using the metal barrier film as a mask to expose an upper surface of the metal barrier film; removing an upper portion of a sidewall of the oxide film between the metal barrier film and the semiconductor substrate to form an oxide-film recess; and forming a first prevention film covering the exposed upper surface of the barrier metal film and filling the oxide-film recess.

The formation of the TSV further includes: forming a second prevention film between the oxide film and the metal barrier film. Each of the first prevention film and the second prevention film is formed of a material having a lower etch selectivity than the oxide film.

The metal barrier film is formed of any of a tantalum (Ta) film, a titanium (Ti) film, and a stack thereof. The metal barrier film is formed to have a thickness of 1000 Å~5000 Å.

In accordance with another aspect of the present invention, a semiconductor device includes: a through silicon via (TSV) passing through a semiconductor substrate; a first prevention film provided between the through silicon via (TSV) and the semiconductor substrate; and a second prevention film formed over the through silicon via (TSV) and extending over the semiconductor substrate; wherein the through silicon via (TSV) is isolated from the semiconductor substrate by the first and the second prevention films.

The first and the second prevention films each include a material with copper anti-diffusion characteristics superior to an oxide material.

The first and the second prevention films each include a nitride material, a poly material, and a combination thereof.

The second prevention film 115a has a step extending from an upper surface of the through silicon via (TSV) down to an upper surface of the semiconductor substrate. The step is a sloped step with an angle less than 90 degrees.

The first prevention film extends in a first direction, and wherein the second prevention film extends in a second direction perpendicular to the first direction.

The second prevention film comprises an extension extending in the first direction and over the first prevention film.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. In the following description of the present invention, a detailed description of related known configurations or functions incorporated herein will be omitted when it would make the subject matter of the present invention unclear.

A semiconductor device and a method for fabricating the same according to the embodiments of the present invention will hereinafter be described with reference to FIGS. 1 to 5.

Figure 1:
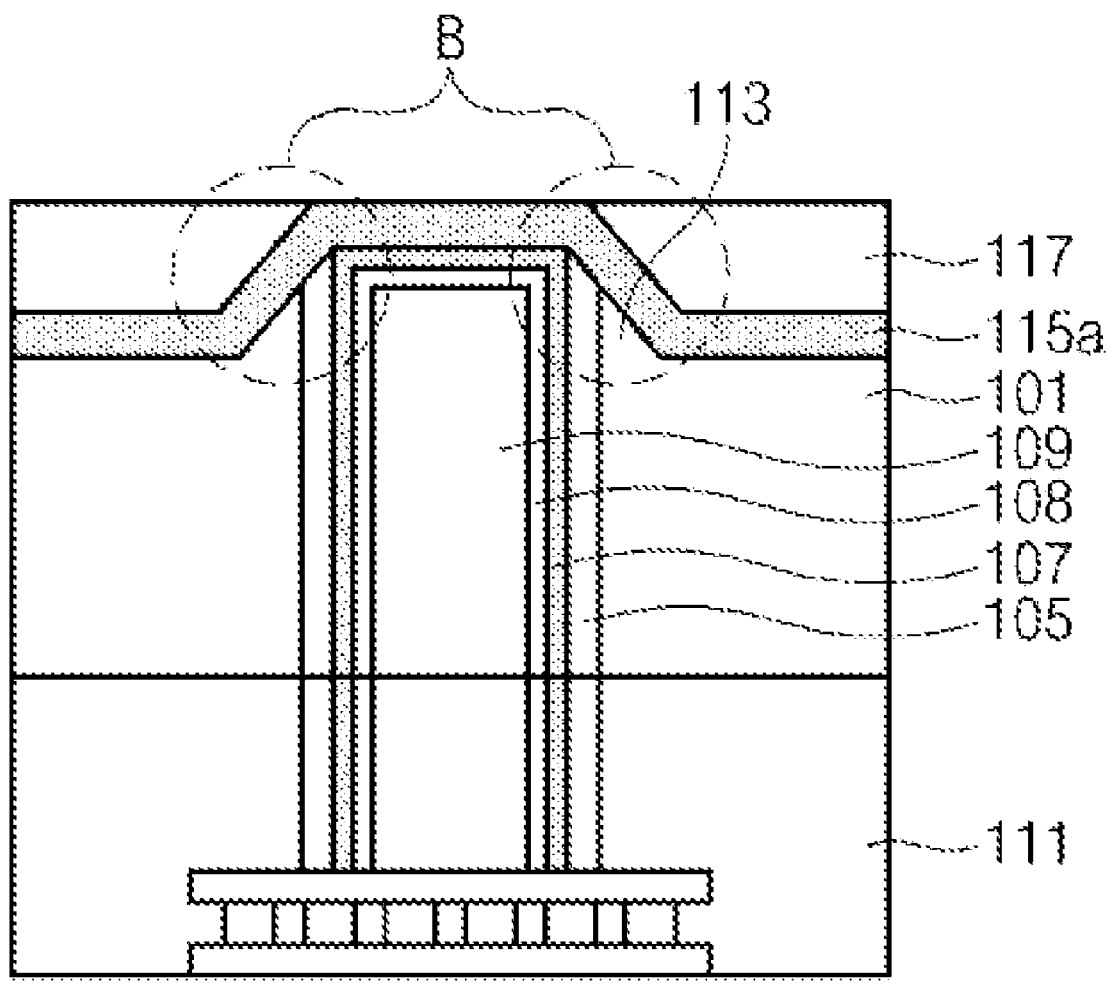
FIG. 1 is a cross-sectional view illustrating a semiconductor device according to a first embodiment of the present invention.

FIG. 1 is a cross-sectional view illustrating a semiconductor device according to a first embodiment of the present invention.

Referring to FIG. 1, the semiconductor device according to a first embodiment of the present invention includes a TSV 109 formed to pass through a semiconductor substrate 101 and an interlayer insulation film 111, a metal barrier film 108 formed to enclose the TSV 109, a prevention film 107 formed to enclose the metal barrier film 108, an oxide film 105 formed at a sidewall of the prevention film 107, and a prevention film 115a formed to a predetermined thickness over the semiconductor substrate 101 and the prevention film 107. In an embodiment, a portion of the semiconductor substrate 101 abutting an upper sidewall of the TSV 109 is formed to be slanted at a predetermined angle to form a slanted portion 113. The prevention film 115a is formed to cover an upper part of the prevention film 107 and over the slanted portion 113, and forms a sloped step at an upper edge (B) of the TSV 109. As a result, the TSV 115a is configured in the form of

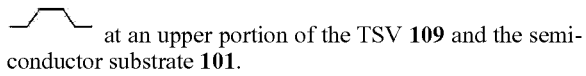 at an upper portion of the TSV 109 and the semiconductor substrate 101.

As described above, according to the first embodiment of the present invention, the upper part of the TSV 109 is covered with the prevention film 115a so that Cu migration is prevented from occurring even if the upper part of the TSV 109 is exposed. In addition, since the prevention film 107 is also formed at a sidewall of the TSV 109, Cu migration is prevented from occurring through the sidewall of the TSV 109.

However, if the semiconductor substrate 101 and the oxide film 105 located at a sidewall of the TSV 109 are completely vertical, and do not have a sloped portion 113, the resultant structure is vulnerable to stress, and a crack may occur in a subsequent deposition process, i.e., when the prevention film 115a is deposited. Thus, it is preferable that the semiconductor substrate 101 and the oxide film 105 are formed to have a predetermined slope at upper edges.

In addition, since the prevention film 115a is formed to have a sloped step at upper edge of the TSV 109, it can prevent a crack or the like, which may otherwise be generated if the prevention film 115a is formed with no slope.

FIGS. 2A to 2L are cross-sectional views illustrating a method for fabricating a semiconductor device according to a first embodiment of the present invention. A method for fabricating the semiconductor device according to the first embodiment of the present invention will hereinafter be described with reference to FIGS. 2A to 2L.

Figure 2A:
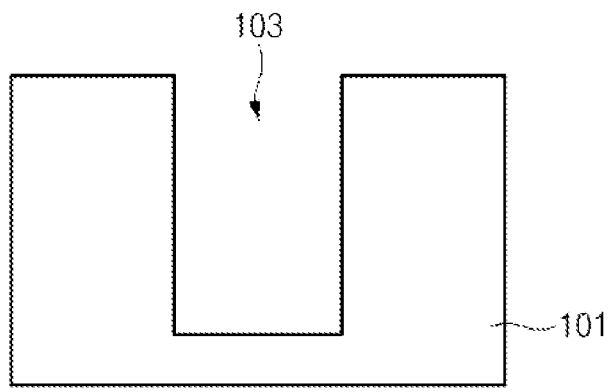
FIGS. 2A to 2L are cross-sectional views illustrating a method for fabricating a semiconductor device according to a first embodiment of the present invention.

Referring to FIG. 2A, a semiconductor substrate 101 and an interlayer insulation layer 111, including a transistor (not shown), are etched so that a vertical hole 103 is formed.

Figure 2B:
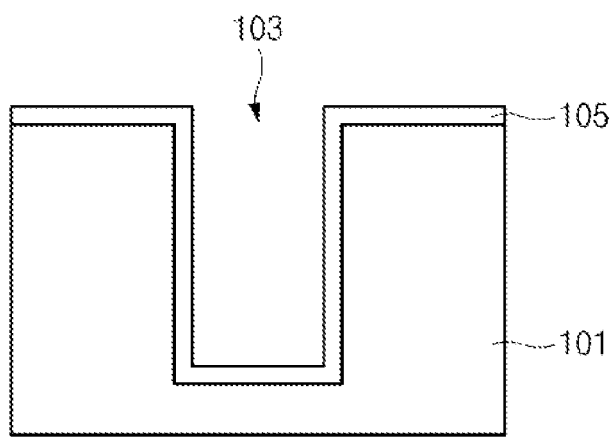

Subsequently, as shown in FIG. 2B, an oxide film 105 having a predetermined thickness is formed over sidewalls and the bottom of the semiconductor substrate 101 and the vertical hole 103.

Figure 2C:
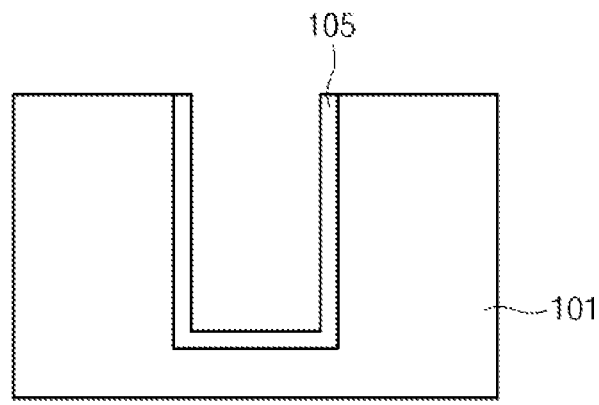

After that, as shown in FIG. 2C, the oxide film 105 is planarized so that an upper surface of the semiconductor substrate 101 is exposed and the oxide film 105 remains only at an inner surface of the vertical hole 103. Preferably, planarization may be performed by chemical mechanical polishing (CMP).

Figure 2D:
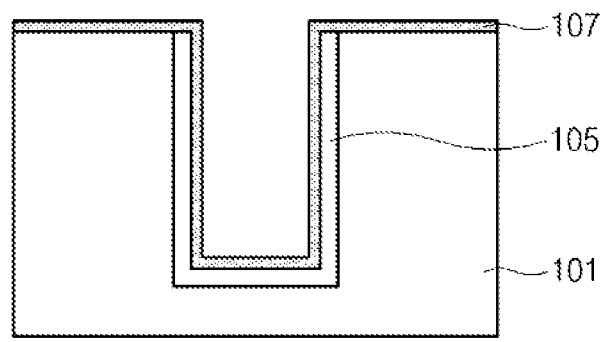

As shown in FIG. 2D, the prevention film 107 is deposited to a predetermined thickness over the sidewalls and the bottom of the vertical hole 103 including the oxide film 105 and over an upper surface of the semiconductor substrate 101.

Figure 2E:
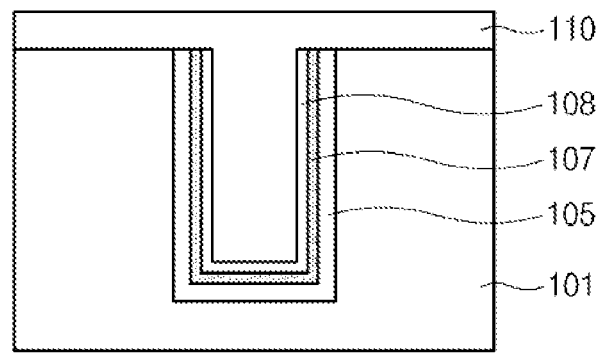

As shown in FIG. 2E, the prevention film 107 is planarized, so that an upper surface of the semiconductor substrate 101 is exposed and the prevention film 107 remains only over an inner surface of the vertical hole 103. Subsequently, a metal barrier film 108 is deposited to a predetermined thickness over the sidewalls and the bottom of the vertical hole 103 including the prevention film 107 and over an upper part of the semiconductor substrate 101, and is then planarized so that the semiconductor substrate 101 is exposed. In an embodiment, the metal barrier film 108 may be formed of a single film such as tantalum (Ta), titanium (Ti), and the like. In another embodiment, the metal barrier film 108 may be stacked as a hybrid form using at least two metal materials. For example, the metal barrier film 108 may be formed of: a stacked structure of tantalum (Ta) and tantalum nitride (TaN); a stacked structure of tantalum (Ta), titanium (Ti) and titanium nitride (TiN); a stacked structure of tantalum (Ta) and tungsten (W); a stacked structure of tantalum (Ta) and tungsten nitride (WN); or a combination thereof. Preferably, the metal barrier film 108 may be formed to have a thickness of 1000~5000 angstroms (Å).

Thereafter, a metal seed is deposited over sidewall and bottom portions of the vertical hole 103, including the oxide film 105, the prevention film 107, and the metal barrier film 108, which have been sequentially deposited. An inner portion of the hole 103 is filled with a metal film 110 grown from the metal seed, which will form the TSV 109. In an embodiment, if the metal seed includes copper (Cu), deposition of the metal seed may be carried out using a sputtering method, and deposition of the metal film 110 may be carried out using an electroplating method. Thereafter, annealing of the metal film 110 is performed so that characteristics of the metal film are improved. The annealing process may be performed at a temperature of about 100 Celsius degrees. The prevention film 107 may be formed of a material having a lower etch selectivity than that of the oxide film 105. For example, the prevention film 107 may be formed of a nitride film, a poly material, etc.

Figure 2F:
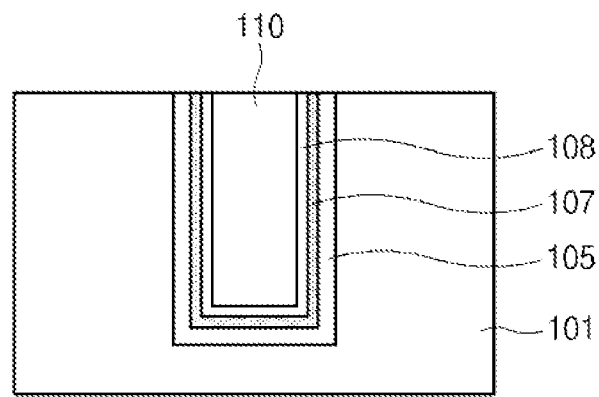

Thereafter, as shown in FIG. 2F, planarization of the metal film 110 is performed so that the TSV 109 is formed in the semiconductor substrate 101.

Figure 2G:
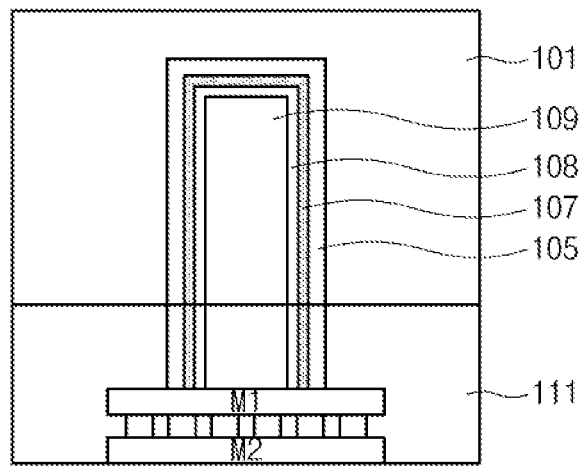

Subsequently, as shown in FIG. 2G, the substrate 101 is turned over so that a back surface of the substrate 101 faces upward. Preferably, the interlayer insulation film 111 may be formed of an oxide material. Thereafter, the TSV 109 is in contact with a bump to be coupled to another TSV or a package pad. The TSV 109 may be indirectly in contact with the bump via metal lines (M1, M2).

Figure 2H:
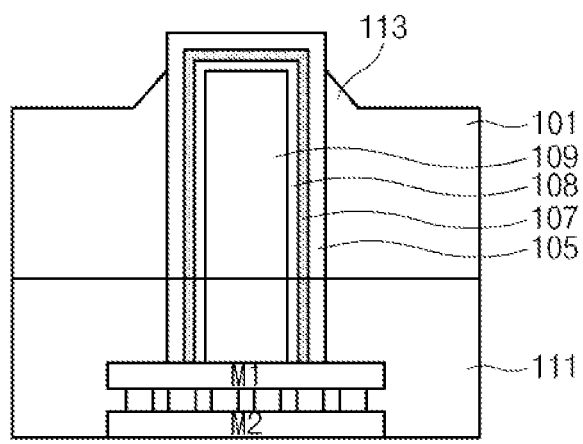

Referring to FIG. 2H, the back surface of the semiconductor substrate 101 is etched so that an upper portion of the TSV 109 is exposed. In an embodiment, a carrier substrate (not shown) connected to the TSV 109 or a metal line M2 of formed over the semiconductor substrate 101 and a bump (not shown) coupled to the carrier substrate (not shown) may be used to grind back the surface of the semiconductor substrate 101.

FIGS. 2H to 2L illustrate that the semiconductor substrate 101 that is turned upside down so that the back surface of the semiconductor substrate 101 is exposed upward. In addition, it should be noted that a method for forming a trench in the semiconductor substrate so as to form the TSV has been shown in FIGS. 2A to 2G for illustrative purposes, and the trench can be formed in various ways for forming the TSV.

Referring again to FIG. 2H, a back surface of the semiconductor substrate 101 is etched to grind the back surface of the semiconductor substrate 101. Thus, the semiconductor substrate 101 over the TSV 109 is etched to expose the oxide film 105. The semiconductor substrate 101 has a sloped step at an upper edge of the TSV 109. To form the sloped step, a tilted etching process may be performed on the semiconductor substrate 101 by mixing HBr gas (1000~2000 sccm), O2 gas (5~10 sccm) and He gas (100500 sccm) in the atmosphere at a high pressure of 500 mT~1000 mT, a top power of 1000 w~1500 w, and a bottom power of 100~500 W.

Preferably, the semiconductor substrate 101 may be etched by a thickness of 10 μm from an upper surface of the TSV 109.

Figure 2I:
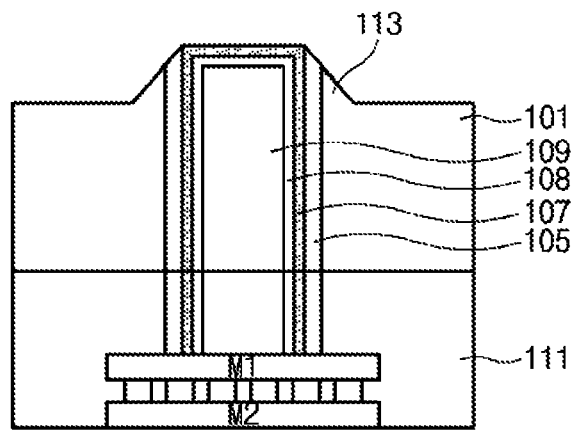
Figure 2J:
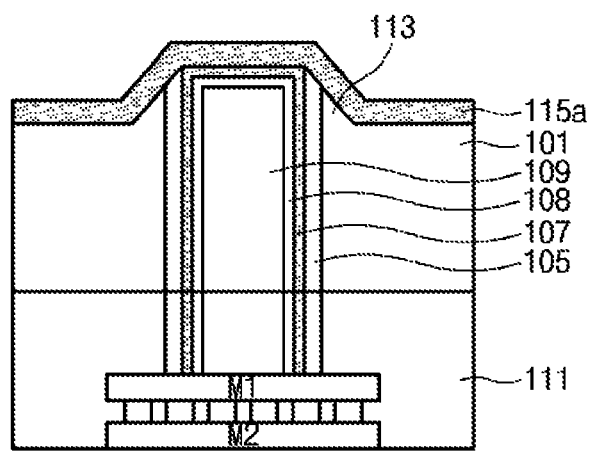

In addition, in case where a carrier substrate (not shown) is mounted over the back side of the semiconductor substrate 101 with a bump interposed between the carrier substrate and the substrate 101, the bump may be used to grind the back surface of the semiconductor substrate 101. In this case, the carrier substrate may be used to support and fix the semiconductor substrate when grinding the back surface of the semiconductor substrate. Subsequently, as shown in FIG. 2I, the upper portion and edges of the oxide film 105 are etched along the sloped step using the prevention film 107 and the metal barrier film 108 as a barrier. That is, the prevention film 107 (and the metal barrier film 108 in case when an excessive etch is performed) on the back side of the semiconductor substrate 101 are exposed, and the oxide film 105 is obliquely etched to align with the sloped portion 113 located at an upper sidewall of the TSV 109. As a result, the backside of the semiconductor substrate 101 and the prevention film 107 over the TSV 109 form a 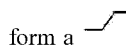 profile. In an embodiment, the oxide film 105 may be etched through a dry or a wet etching process.

If the back grinding process (see FIG. 2H) or the process of etching the oxide film 105 (see FIG. 2I) is performed excessively, an upper portion of the prevention film 107 is removed and the TSV 109 may be exposed. If the TSV 109 is exposed, metal material, i.e., Copper (Cu) particles, which form the TSV 109, may diffuse along the oxide film 105 into an active region of the semiconductor substrate. According to an embodiment of the present invention, to prevent such particles from flowing out of an upper surface of the TSV 109 and diffusing into the active region, a prevention film 115a is provided over the upper surface of the TSV 109, as described below.

As shown in FIG. 23, a prevention film 115a is formed over the TSV 109 so that the TSV 109 is enclosed by the prevention film 115a and the prevention film 107, and is thus isolated from the semiconductor substrate 101. More specifically, the prevention film 115a having a predetermined thickness is deposited over the entire back surface of the semiconductor substrate 101 and the entire surface of the exposed prevention film 107. In an embodiment, the prevention film 115a may be formed of a material having a lower etch selectivity than that of the oxide film 105. For example, the prevention film 115a may be formed of a nitride film, a poly material, or the like.

Figure 2K:
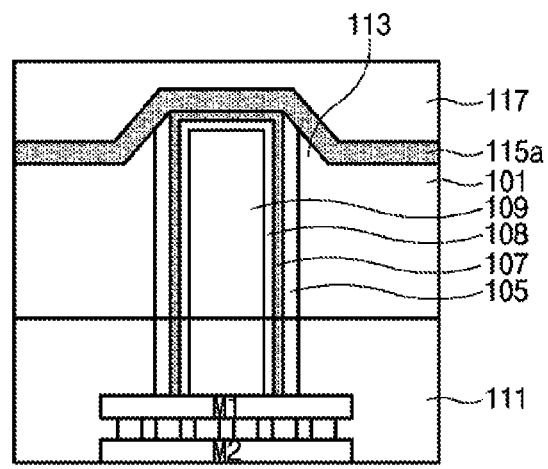

Subsequently, the interlayer insulation film 117 is deposited over the prevention film 115a as shown in FIG. 2K. In an embodiment, the interlayer insulation film 117 may include an oxide material.

Figure 2L:
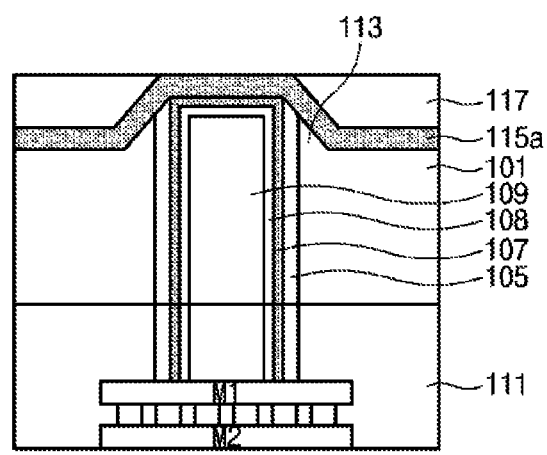

Thereafter, as shown in FIG. 2L, the interlayer insulation film 117 is planarized so that an upper portion of the prevention film 115a is exposed. In an embodiment, planarization may be performed by a CMP process.

As described above, according to the first embodiment of the present invention, an upper portion and upper edges of the oxide film 105 is removed, and replaced with the prevention film 115a. As a result, Cu migration through the oxide film located at an upper portion and sidewall of the TSV 109 may be prevented. In an embodiment, the prevention film 115a may be formed of a material superior to the oxide film 105 in the prevention of Cu diffusion. For example, a nitride-based material can be employed as the prevention film 115a.

In addition, the metal barrier film 108 may be formed to have a predetermined thickness between the prevention film 107 and the TSV 109, and may be formed using a combination of materials (e.g., Ta, TaN, TaW, etc.), so that Cu migration from the upper portion and sidewalls of the TSV 109 can be prevented.

Figure 3:
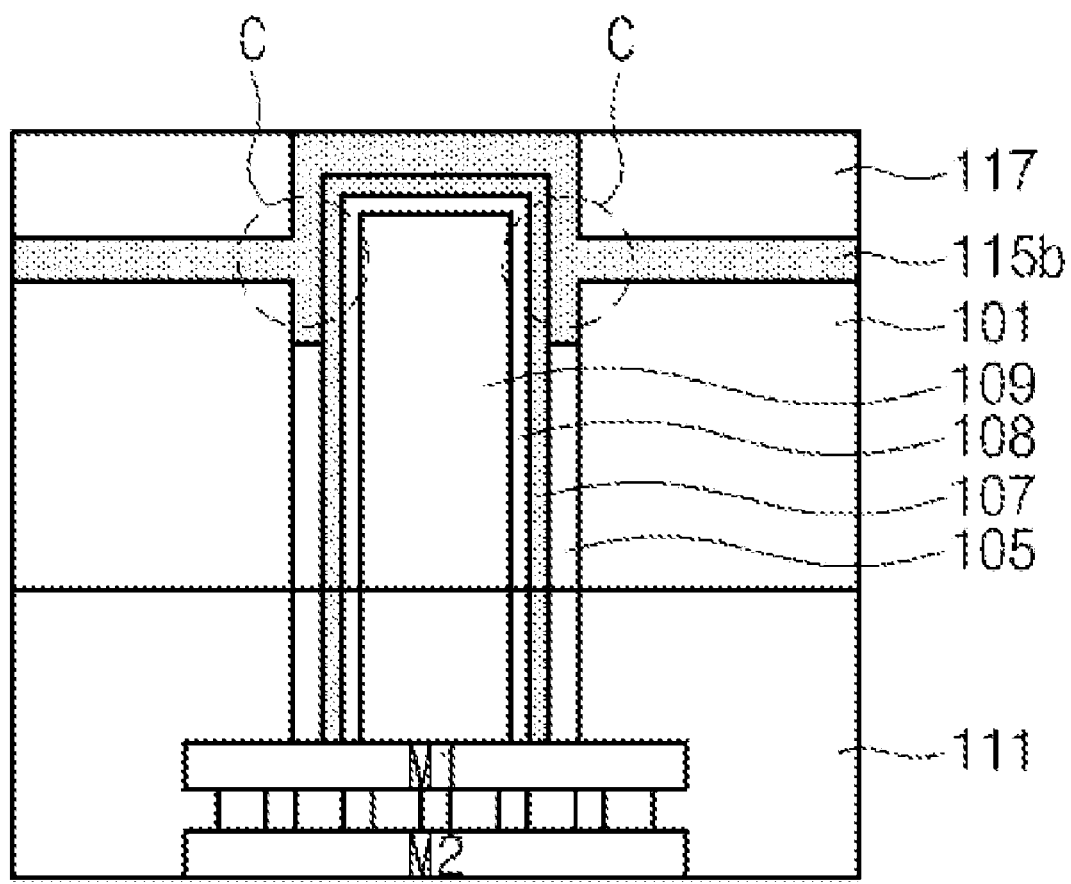
FIG. 3 is a cross-sectional view illustrating a semiconductor device according to a second embodiment of the present invention.

FIG. 3 is a cross-sectional view illustrating a semiconductor device according to a second embodiment of the present invention.

Referring to FIG. 3, the semiconductor device according to the second embodiment of the present invention includes a TSV 109 passing through a semiconductor substrate 101 and an interlayer insulation film 111, a metal barrier film 108 formed to enclose the TSV 109, a prevention film 107 formed to enclose the metal barrier film 108, an oxide film 105 formed over a sidewall of the prevention film 107, and a prevention film 115b formed to have a predetermined thickness over the entire surface of the semiconductor substrate 101 and the prevention film 107 and extending over an oxide-film recess at a sidewall of the TSV 109.

According to the second embodiment, the prevention film 115b is formed to cover an upper portion of the prevention film 107, and an oxide-film recess of the sidewall portion (C) of the prevention film 107, so that the prevention film 115b is formed in a  shape. In other words, the prevention film 115b is provided over the top and upper portions of the sidewalls of TSV 109, such that the prevention film 115 extends laterally over a surface of the semiconductor substrate 101, and extends below the surface of the semiconductor substrate over upper portions of the TSV 109 sidewalls. In an embodiment, prevention film 107 and barrier metal film 108 may be provided between the TSV 109 and the prevention film 115b. Hereinafter, this shape of the prevention film 115b will be referred to as a "hammer shape."

As described above, according to the second embodiment of the present invention, the upper portion of the TSV 109 is covered with the prevention film 115b, and the prevention film 115b is formed in such a manner that the sidewall of the TSV 109 is formed below an exposure location of the semiconductor substrate 101. As a result, Cu migration through the upper portion and sidewall of the TSV 109 can be prevented.

In addition, the prevention film 115b is formed as a hammer shape to prevent Cu migration. The hammer-shaped prevention film 115b can more effectively prevent the occurrence of a crack in the semiconductor substrate 101 and the oxide film 105 than a vertical configuration of a (  ) prevention film shown in FIG. 5.

FIGS. 4A to 4E are cross-sectional views illustrating a method for fabricating a semiconductor device according to a second embodiment of the present invention.

The second embodiment of the present invention may be substantially identical to the first embodiment of the present invention in terms of the above-mentioned fabrication steps shown in FIGS. 2A to 2G, but is different from the first embodiment at least in a process for etching a back surface of the semiconductor substrate 101. As such, a detailed description of same or similar steps will be omitted. A detailed description of the second embodiment of the present invention will be given below with reference to FIGS. 4A to 4E.

Figure 4A:
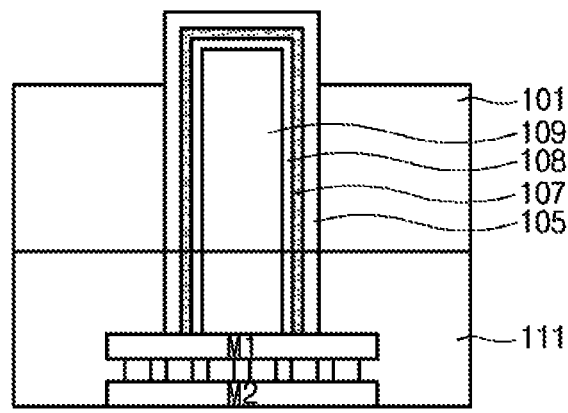
FIGS. 4A to 4E are cross-sectional views illustrating a method for fabricating a semiconductor device according to a second embodiment of the present invention.

Referring to FIG. 4A, the semiconductor substrate 101 is etched so that the oxide film 105 formed over the TSV 109 and an upper sidewall of the oxide film 105 are exposed. In an embodiment, the etched semiconductor substrate 101 is evenly etched perpendicular to the TSV 109 to form a step from the upper surface of the oxide film 105. The step has substantially no slope.

Figure 4B:
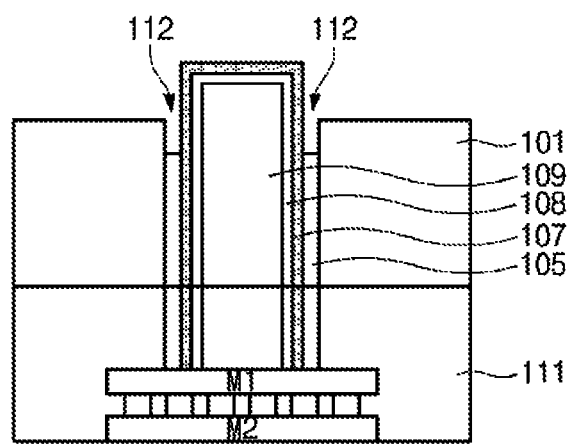

Thereafter, as shown in FIG. 4B, a portion of the oxide film 105 formed over the TSV 109 and over upper sidewalls of the oxide film 105 is etched using the prevention film 107 and the metal barrier film 108 as a barrier. In an embodiment, the upper sidewalls of the oxide film 105 are etched more deeply to form a step down from the exposed upper surface of the semiconductor substrate 101 so that an oxide-film recess 112 is formed. Here, in order to form the oxide-film recess 112, etching conditions can be properly adjusted. For example, an oxide-film etching time may be increased or an etchant may be changed to another etchant, as necessary.

Figure 4C:
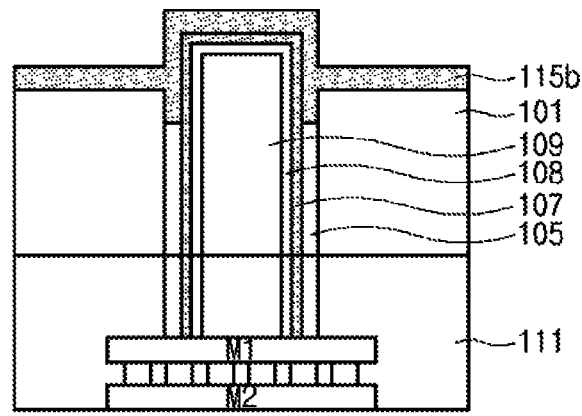

Subsequently, as shown in FIG. 4C, the prevention film 115b is deposited over the semiconductor substrate 101, the prevention film 107, and the oxide-film recess 112. In an embodiment, the prevention film 107 or 115b may be deposited with a material having a lower etch selectivity than the oxide film 105. For example, the prevention film 107 or 115b may be formed of a nitride film or a poly material. As a result, the prevention film 115b is deposited over the upper portion of the TSV 109 and fills the oxide-film recess 112, to prevent Cu migration along the oxide film 105.

Figure 4D:
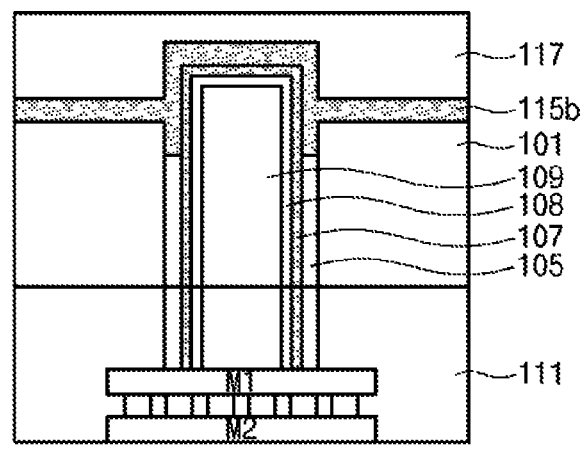

Referring to FIG. 4D, the interlayer insulation film 117 is deposited over the prevention film 115b. The interlayer insulation film 117 may include an oxide material.

Figure 4E:
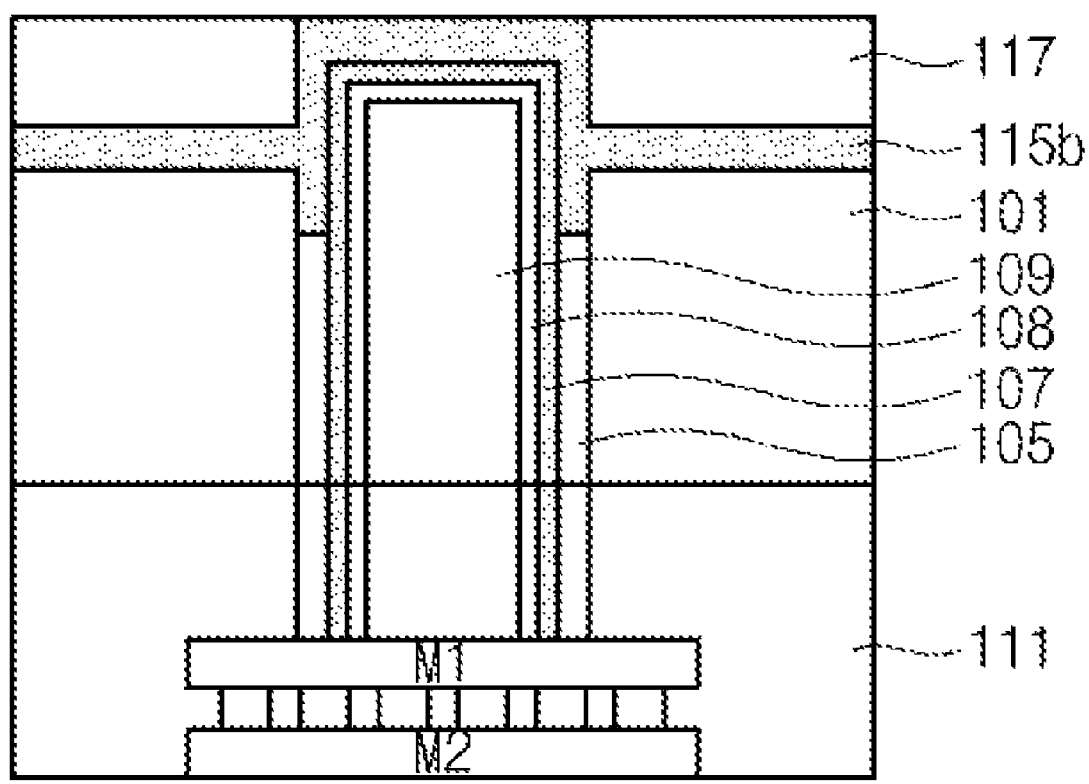

Thereafter, as shown in FIG. 4E, the interlayer insulation film 117 is planarized so that the upper portion of the prevention film 115b is exposed. Preferably, planarization may be performed by chemical mechanical polishing (CMP).

Figure 5:
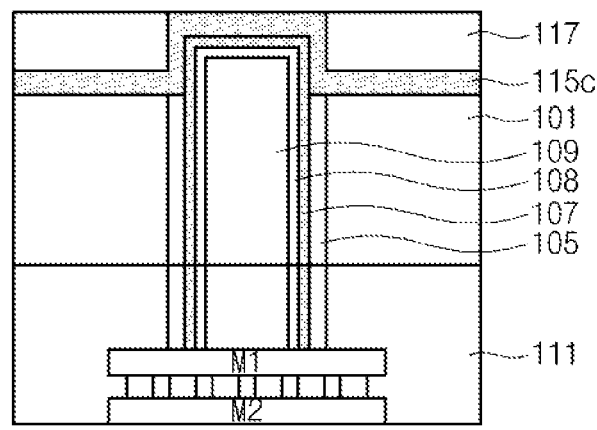
FIG. 5 is a cross-sectional view illustrating a semiconductor device according to a third embodiment of the present invention.

FIG. 5 is a cross-sectional view illustrating a semiconductor device according to a third embodiment of the present invention.

Referring to FIG. 5, the semiconductor device according to a third embodiment of the present invention includes a TSV 109 formed to pass through a semiconductor substrate 101 and an interlayer insulation film 111, a metal barrier film 108 formed to enclose the TSV 109, a prevention film 107 formed to enclose the metal barrier film 108, an oxide film 105 formed at a sidewall of the prevention film 107, and a prevention film 115c formed to have a predetermined thickness over the entire surface of the semiconductor substrate 101 and the prevention film 107 and over upper sidewalls of the oxide film 105.

The prevention film 115c is formed as  shape over the TSV 109 and over the semiconductor substrate 101. That is, according to the third embodiment, the prevention film 115c may be provided over an upper surface and upper portions of the sidewalls of the TSV 109, and extend laterally over the semiconductor substrate 101. However, in contrast to the second embodiment, in the third embodiment, the prevention film 115c may not extend below the upper surface of the semiconductor substrate 101. The prevention film 115c according to the third embodiment may prevent Cu migration through the upper portion and sidewall of the TSV 109.

The semiconductor fabrication method of the third embodiment shown in FIG. 5 may be substantially identical to the processes shown in FIGS. 4A to 4E except the process for forming the oxide-film recess 112. Detailed description of such processes will herein be omitted for convenience of description and better understanding of the present invention.

As described in the aforementioned first to third embodiments of the present invention, the metal barrier film 108 is deposited to a predetermined thickness over the upper portion and sidewalls of the TSV 109, so that it can more efficiently prevent Cu migration from being generated.

In an embodiment, although the first to third embodiments of the present invention have exemplarily disclosed that the prevention films (115a, 115b, 115c) formed over the TSV 109 and the prevention film 107 formed at a sidewall of the TSV 109 are employed in combination, it should be noted that the first to third embodiments can prevent Cu migration from being generated even when the prevention films (115a, 115b, 115c) deposited over the TSV 109 are formed but the sidewall's prevention film 107 are not provided or when the sidewall's prevention film 107 is formed without formation of the prevention films (115a, 115b, 115c) deposited over the TSV 109.

In addition, the metal barrier film 108 shown in the first to third embodiments of the present invention may be formed of a single film made of tantalum (Ta) or titanium (Ti). The metal barrier film 108 may be stacked as a hybrid form using at least two metal materials. For example, the metal barrier film 108 may be formed of at least one of a stacked structure of tantalum (Ta) and tantalum nitride (TaN); a stacked structure of tantalum (Ta), titanium (Ti) and titanium nitride (TiN); a stacked structure of tantalum (Ta) and tungsten (W); and a stacked structure of tantalum (Ta) and tungsten nitride (WN). Preferably, the metal barrier film 108 may be formed to have a thickness of 1000~5000 angstroms.

In addition, each of the prevention film 107 over the sidewall of the TSV 109 and the prevention films (115a, 115b, 115c) formed over the upper surface of the TSV 109 according to the first to third embodiments of the present invention may be formed of a material having a lower etch selectivity than the oxide film 105. For example, the prevention film 107, 115a, 115b, or 115c may be formed of a nitride material or a poly material. In an embodiment, the prevention film 107 or the prevention film (115a, 115b or 115c) may be formed of the same material capable of preventing Cu migration or may also be formed of different materials.

As is apparent from the above description, a semiconductor device and a method for fabricating the same according to the present invention can prevent Cu migration from being generated when forming a through silicon via (TSV), so that generation of a bit-line contact crack is prevented and a production yield of semiconductor devices is improved.

Those skilled in the art will appreciate that the present invention may be carried out in other specific ways than those set forth herein without departing from the spirit and essential characteristics of the present invention. The above exemplary embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein. Also, it is obvious to those skilled in the art that claims that are not explicitly cited in each other in the appended claims may be presented in combination as an exemplary embodiment of the present invention or included as a new claim by a subsequent amendment after the application is filed.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for fabricating a semiconductor device comprising:
   forming a hole in a semiconductor substrate;
   forming an oxide film and a metal barrier film over an inner surface of the hole, and filling the hole with a conductive material to form a Through Silicon Via (TSV);
   removing a back side of the semiconductor substrate by a predetermined depth to expose the oxide film;
   removing the oxide film using the metal barrier film as a mask; and
   forming a first prevention film to cover an upper portion of the metal barrier film.

2. The method according to claim 1, wherein the formation of the TSV further includes:
   forming a second prevention film between the oxide film and the barrier metal film.

3. The method according to claim 1, wherein the removing of the semiconductor substrate includes:
   etching the semiconductor substrate so that a portion of the semiconductor substrate has a sloped step down from an upper surface of the TSV.

4. The method according to claim 3, wherein the formation of the first prevention film includes:
   forming the first prevention film to (i) cover the upper surface of the TSV and (ii) and cover the sloped step portion of the semiconductor substrate.

5. The method according to claim 1, wherein the removing of the semiconductor substrate includes:
   etching the semiconductor substrate by using HBr gas of 1000~2000 sccm, $O_2$ gas of 5~10 sccm, and He gas of 100~500 sccm in a high pressure of 500~1000 mT, with a top power of 1000~1500 W, and with a bottom power of 100~500 W.

6. A method for fabricating a semiconductor device comprising:
- forming a hole in a semiconductor substrate;
- forming an oxide film and a metal barrier film over an inner surface of the hole, and filling the hole with a conductive material to form a Through Silicon Via (TSV);
- removing a back side of the semiconductor substrate using the oxide film as a mask to expose an upper surface of the oxide film;
- removing the exposed upper surface of the oxide film using the metal barrier film as a mask to expose an upper surface of the metal barrier film;
- removing an upper portion of a sidewall of the oxide film between the metal barrier film and the semiconductor substrate to form an oxide-film recess; and
- forming a first prevention film covering the exposed upper surface of the barrier metal film and filling the oxide-film recess.

7. The method according to claim 6, wherein the formation of the TSV further includes:
- forming a second prevention film between the oxide film and the metal barrier film.

8. The method according to claim 2, wherein each of the first prevention film and the second prevention film is formed of a material having a lower etch selectivity than the oxide film.

9. The method according to claim 1, wherein the metal barrier film is formed of any of a tantalum (Ta) film, a titanium (Ti) film, and a stack thereof.

10. The method according to claim 1, wherein the metal barrier film is formed to have a thickness of 1000~5000 angstroms.

* * * * *